United States Patent [19]

Bayer

[11] Patent Number: 5,525,925
[45] Date of Patent: Jun. 11, 1996

[54] SIMPLE POWER MOSFET LOW SIDE DRIVER SWITCH-OFF CIRCUIT WITH LIMITED DI/DT AND FAST RESPONSE

[75] Inventor: Erich Bayer, Ergolding, Germany

[73] Assignee: Texas Instruments Incorporated, Dallas, Tex.

[21] Appl. No.: 200,377

[22] Filed: Feb. 22, 1994

Related U.S. Application Data

[63] Continuation of Ser. No. 951,712, Sep. 25, 1992, abandoned.

[51] Int. Cl.$^6$ .......................... H03K 17/04; H03K 17/16; H03K 17/687; H03K 3/00
[52] U.S. Cl. .......................... 327/377; 327/389; 327/427; 327/108; 327/110
[58] Field of Search ...................................... 307/571, 270, 307/246, 572, 573; 327/108, 110, 374, 377, 387, 389, 427

[56] References Cited

U.S. PATENT DOCUMENTS

| | | | |
|---|---|---|---|
| 4,504,779 | 3/1985 | Haman | 323/349 |
| 4,540,899 | 9/1985 | Pelly | 327/110 |
| 4,890,020 | 12/1989 | Bird | 307/571 |
| 4,904,889 | 2/1990 | Chieli | 307/571 |
| 5,027,018 | 6/1991 | Kindlmann et al. | 307/571 |
| 5,204,561 | 4/1993 | Rischmüller | 307/571 |
| 5,313,109 | 5/1994 | Smith | 307/572 |

FOREIGN PATENT DOCUMENTS

| | | | |
|---|---|---|---|
| 2012382 | 4/1990 | Germany | H03K 17/08 |

Primary Examiner—David C. Nelms
Assistant Examiner—Trong Phan
Attorney, Agent, or Firm—Thomas G. Eschweiler; James C. Kesterson; Richard L. Donaldson

[57] ABSTRACT

An output circuit includes a power MOSFET with a gate connected to a plurality of diodes, the plurality of diodes forming a diode string. A resistor is connected in parallel with the diode string. A switch is connected between the opposite end of the diode string and circuit ground. A control terminal of the switch is connected to the circuit input and determines whether the circuit is turned on or turned off. An inductive load is connected to a drain terminal of the power MOSFET. The opposite end of the inductive load is connected to a power supply. A source terminal of the power MOSFET is connected to circuit ground thus providing a low-side driver circuit configuration. The resistor and diode string, connected in parallel, along with the switch provide a two-phase, soft turn-off mechanism which allows the power MOSFET to dissipate the energy stored in the inductive load without the power MOSFET entering breakdown, therefore improving the circuit's reliability.

9 Claims, 4 Drawing Sheets

SIMPLE POWER MOSFET LOW SIDE DRIVER SWITCH-OFF CIRCUIT WITH LIMITED DI/DT AND FAST RESPONSE

This application is a continuation of application Ser. No. 07/951,712, filed Sep. 25, 1992, now abandoned.

FIELD OF THE INVENTION

This invention is in the field of integrated circuits, and is directed to circuitry for switching inductive loads.

BACKGROUND OF THE INVENTION

Many applications of power integrated circuits require driving inductive loads such as relays and solenoids. Driving an inductive load necessitates appropriate circuitry to dissipate energy stored in the inductive load when the integrated driver circuit switches off. Circuit designers currently use several different methods to deal with this energy dissipation issue.

A common problem for circuit designers is illustrated in FIG. 1. In FIG. 1, a power MOSFET 12 has a source coupled to circuit ground and a drain coupled to an inductive load 14. Inductive load may be composed of a solenoid or a resistive type load with an inductance associated with a connecting cable. A short detection circuit 18 monitors load 14. In the event that load 14 becomes short circuited, (an automechanic shorting load 14 with a screwdriver may be one example) short detection circuit 18 manipulates a switch 20 to discharge the voltage on the gate of transistor 12 thus turning transistor 12 off. This "fast turn-off" triggers an inductive flyback at the drain terminal of power MOSFET 12. Inductive flyback occurs because current cannot change instantaneously through an inductor; therefore the output node voltage will increase to a large positive value very quickly when power MOSFET 12 turns off. This phenomena is well known and understood by those skilled in the art. The circuit configuration in FIG. 1 is referred to as a low side driver and is also well known by those skilled in the art. The method employed in FIG. 1 does not add any additional circuitry and allows power MOSFET 12 to handle the energy dissipated by load 14. When the inductive flyback voltage reaches the breakdown voltage of power MOSFET 12, MOSFET 12 begins to conduct in the reverse biased avalanche mode and will dissipate all the energy that was stored in the inductive load during the conduction cycle.

This method has a serious drawback; namely a reliability issue. When power MOSFET 12 turns off and experiences inductive flyback, it breaks down. When breakdown occurs the junction breaks down nonuniformly causing "hot spots" to appear at junctions in MOSFET 12 where current has concentrated in localized areas. High current concentrations in localized areas lead to transistor damage and long term reliability problems.

Another prior art method used to dissipate energy in switching is to place a clamping diode in parallel with power MOSFET 12 as shown in FIG. 2. In FIG. 2, a clamping diode 16 is placed in parallel with power MOSFET 12. Diode 16 is oriented such that the cathode is coupled to the drain of MOSFET 12 and the anode is coupled to circuit ground.

The circuit of FIG. 2 works similarly to the circuit of FIG. 1 with the exception occurring during MOSFET 12 switching. When switch 20 is closed the gate of MOSFET 12 is discharged through switch 20 and power MOSFET 12 will turn off thereby initiating the inductive flyback. Due to the inductive flyback, the output node voltage increases quickly; when this voltage reaches the breakdown voltage of clamping diode 16 (clamping diode 16 is designed to break down at a lower voltage than power MOSFET 12 breakdown) clamping diode 16 will break down and dissipate the energy stored in inductive load 14 during the conduction cycle.

A disadvantage of this method is that clamping diode 16 requires a significant amount of semiconductor die area for the circuit layout. This occurs because clamping diode 16 must dissipate a large amount of energy when power MOSFET 12 is switching high currents. Because of the large amount of energy, clamping diode 16 must occupy approximately the same die area as large power MOSFET 12. This alternative, therefore, has a negative impact, especially in multiple output devices, on making the power integrated circuit a cost-effective alternative to discrete power solutions.

As power integrated circuits switch larger currents and dissipate larger amounts of energy, better methods must be developed to provide switching reliability at a competitive cost.

It, accordingly, is an object of this invention to provide a circuit and method of dissipating the stored energy in inductive loads during switching that will protect the output device, conserve die area, and provide long term circuit reliability. Other objects and advantages of the invention will be apparent to those of ordinary skill in the art having reference to the following specification and drawings.

SUMMARY OF THE INVENTION

An output circuit includes a power MOSFET with a gate connected to a plurality of diodes, the plurality of diodes forming a diode string. A resistor is connected in parallel with the diode string. A switch is connected between the opposite end of the diode string and circuit ground. A control terminal of the switch is connected to the circuit input and determines whether the circuit is turned on or turned off. An inductive load is connected to a drain terminal of the power MOSFET. The opposite end of the inductive load is connected to a power supply. A source terminal of the power MOSFET is connected to circuit ground thus providing a low-side driver circuit configuration. The resistor and diode string, connected in parallel, along with the switch provide a two-phase, soft turn-off mechanism which allows the power MOSFET to dissipate the energy stored in the inductive load without the power MOSFET entering breakdown, therefore improving the circuit's reliability.

DETAILED DESCRIPTION OF THE PREFERRED EMBODIMENT

Figure 1:
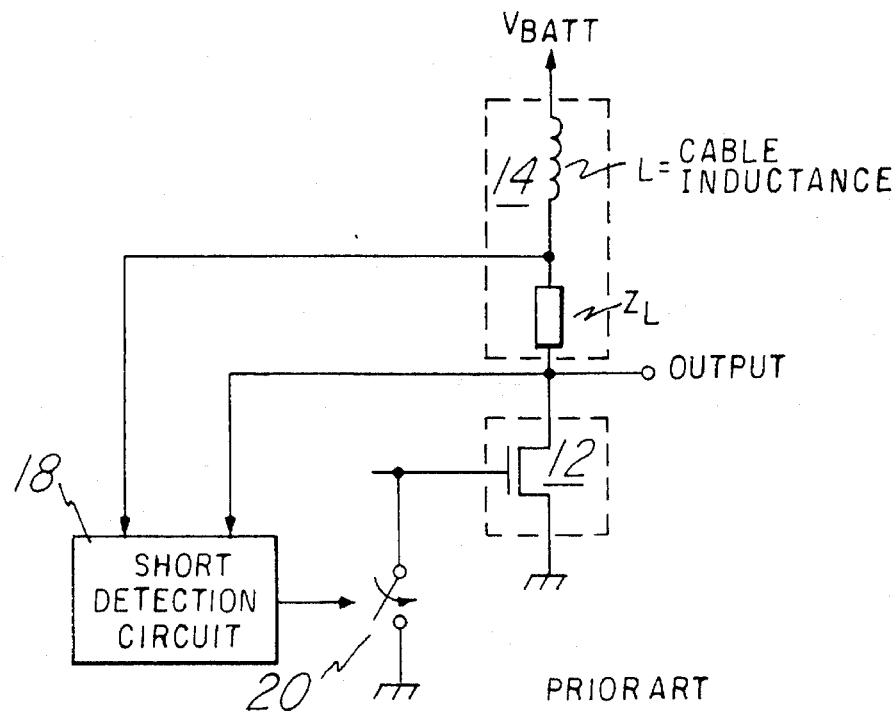
FIG. 1 is a circuit diagram illustrating a prior art output circuit.
Figure 2:
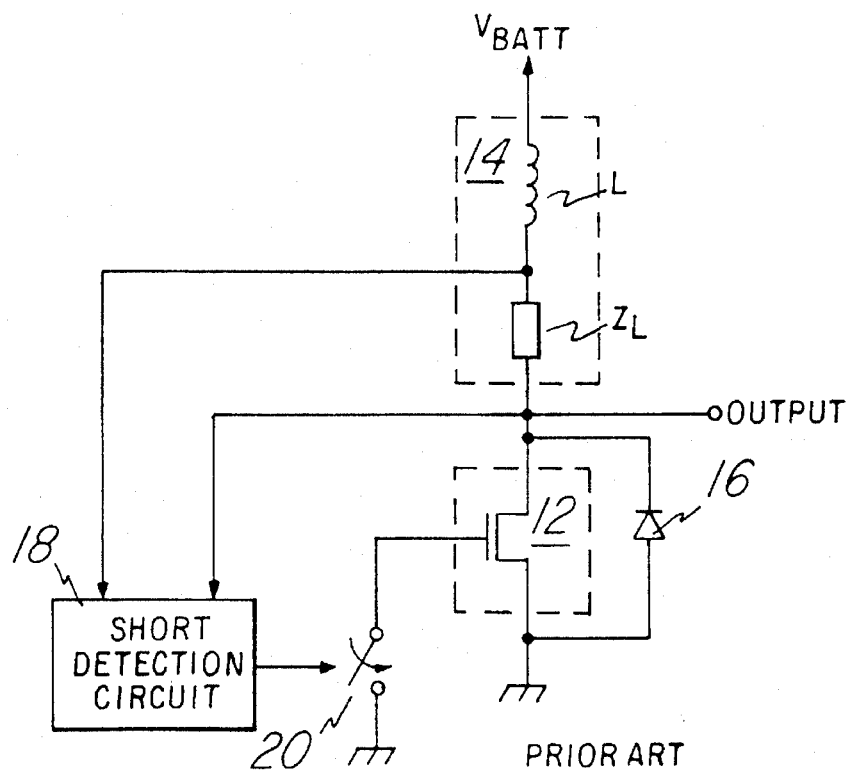
FIG. 2 is a circuit diagram illustrating a prior art output circuit with clamp circuitry.
Figure 3:
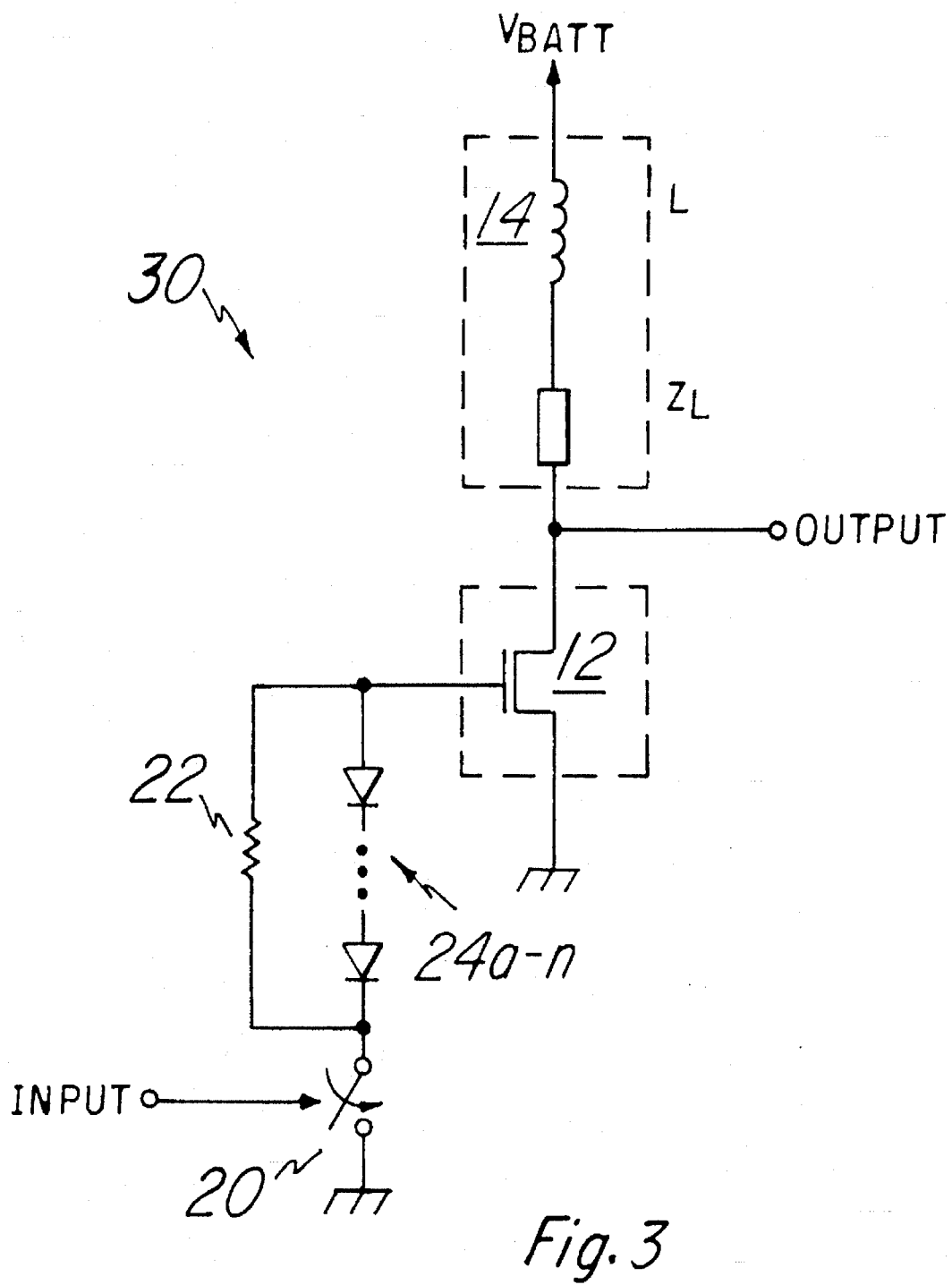
FIG. 3 is a circuit diagram illustrating the preferred embodiment of the invention.

FIG. 3 is a circuit diagram illustrating the preferred embodiment of the invention, a novel low-side driver circuit 30. A power MOSFET transistor 12 has a source terminal connected to circuit ground and a drain terminal connected to a load 14. Load 14 is inductive; it may have resistive and inductive components (such as a solenoid) or may be completely resistive with an inductive component associated with cabling. Power MOSFET 12 has a gate terminal connected to a plurality of diodes 24a–n connected together in series to form a diode string 24a–n. A resistor 22 is also connected to the gate terminal of power MOSFET 12 and to the opposite end of diode string 24a–n such that resistor 22 is in parallel with diode string 24a–n. A switch 20 is connected between the opposite end of diode string 24a–n and circuit ground. A control terminal of switch 20 is connected to the input of circuit 30.

Figure 4:
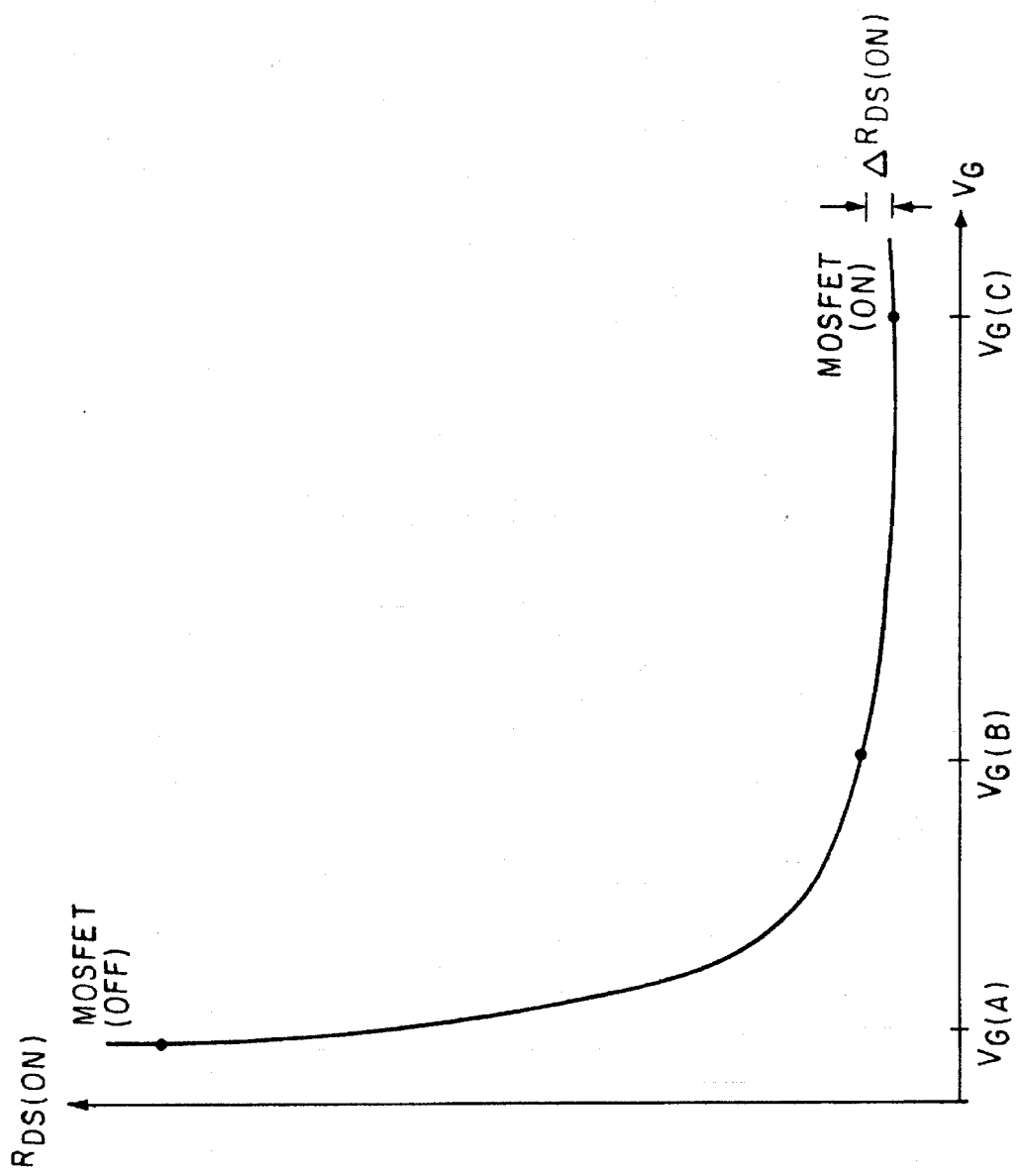
FIG. 4 is a graphical diagram illustrating the relationship between gate voltage and Rds(on) in the preferred embodiment of the invention.

FIG. 4 is a graphical diagram illustrating the relationship between the gate voltage (Vg) and Rds(on) of power MOSFET 12. The Rds(on) of power MOSFET 12 is the effective resistance exhibited by power MOSFET 12 at any point in time. When MOSFET 12 is not conducting (or OFF), the Rds(on) is ideally infinite and when conducting (or ON), Rds(on) is ideally zero. It can be seen from FIG. 4 that the relationship between Vg and Rds(on) is a continuous function, therefore at certain values of Vg, MOSFET 12 may conduct partially.

The functional operation of the invention is now described. In FIG. 3, MOSFET 12 is initially conducting. Therefore, the gate voltage (Vg) is around 5 V and the Rds(on) is low. How one may achieve this initial condition is well known to one of ordinary skill in the art. Several circuit solutions exist such as a switchable voltage source with high impedance off state as shown in circuit 108 in FIG. 5 or a switchable current source circuit as shown in circuit 206 in FIG. 6. Both circuits effectively provide the initial condition described.

Figure 5:
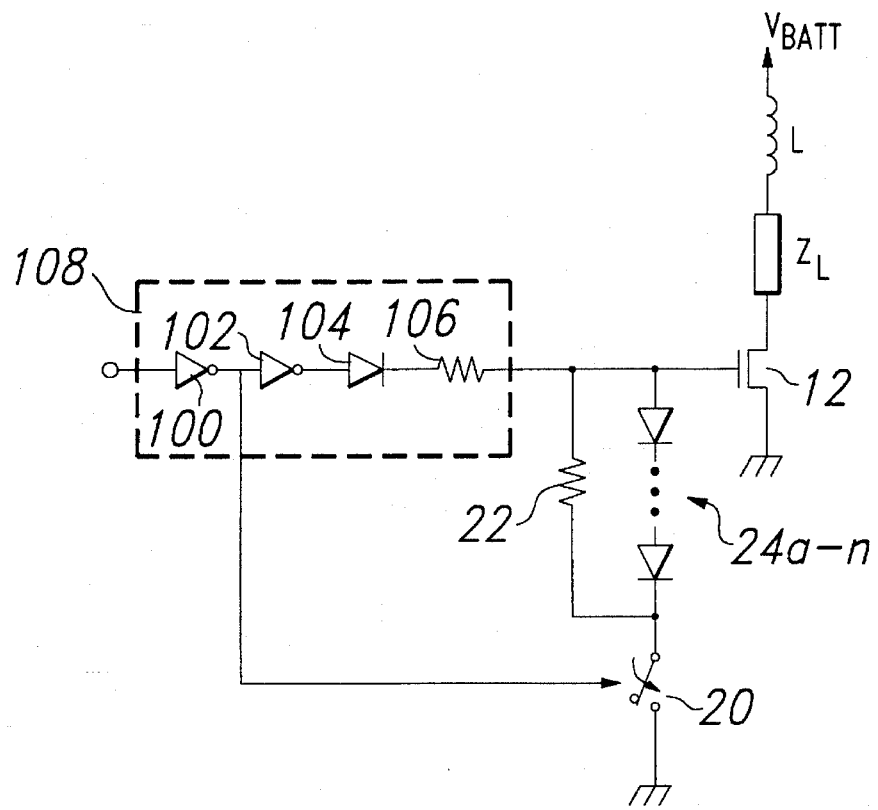
FIG. 5 is a schematic diagram illustrating a switchable voltage source circuit 108 for circuit 30 of FIG. 3.

In FIG. 5, when the input of inverter 100 is at a logic "high" voltage the input (control terminal of switch 20) is a logic "low" and switch 20 is open. Inverter inverts the signal to a logic "low" and inverter 102 again inverts the signal to a logic "high." The logic "high" is passed through diode 104 and resistor 106 and therefore causes power MOSFET 12 to conduct and charge to accumulate on the gate of power MOSFET 12. In this way the initial condition is easily achieved.

Figure 6:
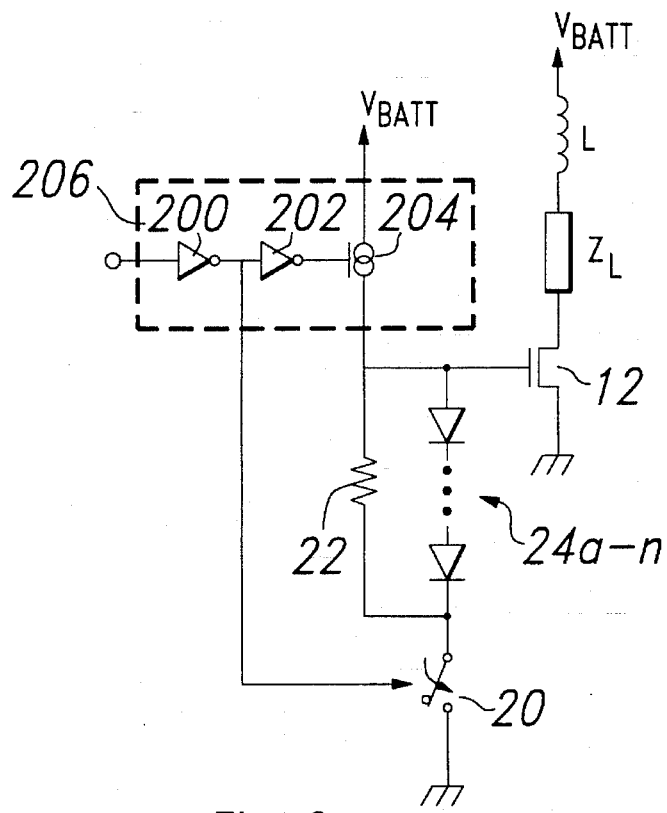
FIG. 6 is a schematic diagram illustrating a switchable current source circuit 206 for circuit 30 of FIG. 3.

In FIG. 6, when the input of inverter 200 is a logic "high" the input (control terminal of switch 20) is a logic "low" and switch 20 is open. The output of inverter 20 is again inverted in inverter 202 so that its output is a logic "high." A logic "high" at the input of switchable current source 204 causes current to flow from power supply $V_{batt}$ and charge up the gate of power MOSFET 12 thus turning it on. In this manner the initial condition may be alternatively achieved easily. This corresponds to point C on FIG. 4. When control circuitry wants to turn off power MOSFET 12 the input node in FIG. 3 is activated, thus closing switch 20. At that instant, Vg forward biases diode string 24a–n and the charge stored on the capacitor formed by the gate-to-source (Cgs) capacitance of power MOSFET 12 is discharged in diode string 24a–n extremely quickly. As Vg decreases it eventually reaches a voltage where:

$$Vg = n*Vd$$

wherein Vd represents the forward bias voltage drop of each individual diode in diode string 24a–n. At this particular gate voltage (Vg), diode string 24a–n stops conducting and no longer participates in the discharge of the gate of MOSFET 12. This condition corresponds to point B in FIG. 4 and resistor 22 now provides the discharge path to discharge the remaining charge on the gate of MOSFET 12. After the completion of discharging the gate of MOSFET 12, MOSFET 12 has turned off and corresponds to point A in FIG. 4.

An advantageous feature shown in FIG. 3 is that circuit 30 turns off MOSFET 12 in two distinct phases: Phase I and Phase II. In Phase I, which takes place between points C and B in FIG. 4, MOSFET 12 is fully conducting and the turn-off procedure has been initiated. Input node closes switch 20 and the charge on the capacitor (Cgs) begins to discharge through the path of least resistance which is diode string 24a–n. This phase, Phase I, is made as fast as possible so that more time may be used in the execution of Phase II. During Phase I, a large change in gate voltage (Vg) corresponds to a very small change in the Rds(on) of MOSFET 12. At point B in FIG. 4 the gate voltage conforms to:

$$Vg = n*Vd$$

and diode string 24a–n discontinues conduction. It is important to note that the rate of discharge of Vg during Phase I corresponds to the following time constant:

$$\tau_I = R(\text{diode string})*Cgs$$

wherein R(diode string) represents the forward bias resistance of diode string 24a–n. Since R(diode string) is very small the discharge time constant ($\tau_I$), and therefore the turn-off rate, is fast.

In Phase II, diode string 24a–n has discontinued conduction and the discharge of gate voltage (Vg) takes place through the path of least resistance, which is now resistor 22. This significantly slows the rate of discharge of Vg and therefore slows the rate of turn-off of MOSFET 12. The rate of discharge of Vg corresponds to the following time constant:

$$\tau_{II} = R*CgS$$

wherein R represent the value of resistor 22 and is many orders of magnitude larger than R(diode string). This corresponds to the section between points B and A in FIG. 4. During this time a small change in gate voltage results in a large change in Rds(on) of MOSFET 12. This slow turn-off (often called a soft turn-off in the industry) in Phase II prevents large voltage spikes from forming at the drain of MOSFET 12 due to inductive flyback. Inductive flyback is well known and characterized by the following relationship:

$$V = L*di/dt$$

The voltage (V) in this relationship reflects the voltage that is present at the drain of MOSFET 12. In Phase I, the voltage (V) is minimized by minimizing the change in current (di) in the above relationship. It can be seen in FIG. 4 that between points C and B the Rds(on) of MOSFET 12 only reduced slightly, therefore the change in current (di) is small. In Phase II, the voltage at the drain of MOSFET 12 is minimized by maximizing the change in time (dt) in the above relationship. It can be seen in FIG. 4 that between points B and A the Rds(on) changes greatly however the rate at which Rds(on) is changing is slow as seen by the time constant of Phase II ($\tau_{II}$ = R * Cgs). Thus the rate of discharge and therefore the rate of change of Rds(on) is slowed, "dt" is maximized, and inductive flyback at the drain of MOSFET 12 is minimized.

By closely examining FIG. 4 it is apparent that the number of diodes (n) chosen in diode string 24a–n is important. The number of diodes (n) chosen in diode string 24a–n will vary dependent upon the process used and the physical characteristics of MOSFET 12. In general it is desired to meet the following two constraints for optimum performance:

Maximize: Vg(@C)–Vg(@B), and

Minimize: ▲ Rds(on) from C to B.

Meeting the above constraints minimizes the duration of Phase I and thus provides more time for Phase II.

The novel low-side driver circuit 30 of FIG. 3 provides reliable power MOSFET 12 turn-off by splitting MOSFET 12 turn-off into two phases wherein one phase minimizes the change in current through MOSFET 12 and a second phase maximizes the time of turn-off of MOSFET 12 such that the inductive flyback voltage at the drain of MOSFET 12 is minimized. Minimizing inductive flyback voltage at the drain of MOSFET 12 improves circuit 30 reliability by preventing MOSFET 12 breakdown.

Although the invention has been described with reference to the preferred embodiment herein, this description is not to be construed in a limiting sense. Various modifications of the disclosed embodiment will become apparent to persons skilled in the art upon reference to the description of the invention. It is therefore contemplated that the appended claims will cover any such modifications or embodiments as fall within the true scope of the invention.

What is claimed is:

1. An output circuit having an input and an output, comprising:
   a power MOSFET having a source terminal, a drain terminal and a gate terminal, the source terminal connected to circuit ground potential and the drain terminal connected to the output of the circuit output;
   an inductive load connected to the drain terminal of the power MOSFET; and
   a soft turn-off circuit connected between the gate terminal of the power MOSFET and the input of the output circuit, wherein the turn-off circuit is operable to turn-off the power MOSFET in a plurality of phases.

2. An output circuit having an input and an output, comprising:
   a power MOSFET having a source terminal, a drain terminal and a gate terminal, the source terminal connected to circuit ground potential and the drain terminal connected to the output of the circuit output;
   an inductive load connected to the drain terminal of the power MOSFET; and
   a soft turn-off circuit connected between the gate terminal of the power MOSFET and the input of the output circuit, wherein the turn-off circuit is operable to turn-off the power MOSFET in a plurality of phases, wherein the soft turn-off circuit comprises:
      a plurality of diodes connected together in series wherein an anode of the first diode in the plurality of diodes is connected to the gate terminal of the power MOSFET and an anode of the second diode in the plurality of diodes is connected to a cathode of the first diode such that the plurality of diodes form a diode string;
      a resistor connected to the gate terminal of the power MOSFET and to a cathode of the last diode in the diode string such that the resistor is in parallel with the diode string; and
      a switch with one terminal connected to the cathode of the last diode in the diode string and a second terminal connected to circuit ground potential and a control terminal connected to the input of the output circuit.

3. The output circuit of claim 2 wherein the soft turn-off circuit separates the turn-off of power MOSFET into two phases, the first phase quickly discharging the gate terminal of the power MOSFET through the plurality of diodes wherein the plurality of diodes have a first resistance value without a large change in current through the power MOSFET and the second phase slowly discharging the gate terminal of the power MOSFET through the resistor wherein the resistor has a second resistance value and wherein the second resistance value is substantially larger than the first resistance value such that the change in current through the power MOSFET occurs slowly thereby eliminating voltage spikes at the drain terminal of the power MOSFET due to inductive flyback and increasing the reliability of the output circuit.

4. A method of eliminating MOSFET breakdown caused by inductive flyback in circuits driving inductive loads, comprising the steps of:
   initiating turn-off of the MOSFET;
   discharging the gate of the MOSFET through a first resistive path until the gate voltage drops below a predetermined voltage;
   discharging the remainder of the gate voltage of the MOSFET through a second resistive path until the gate of the MOSFET is completely discharged.

5. The method of claim 4 wherein initiating turn-off of the MOSFET entails manipulating a switch connected to the first and second resistive paths, the resistive paths beings in parallel with one another, thereby closing the switch and allowing the discharge of the gate voltage of the MOSFET through the first resistive path.

6. The method of claim 4 wherein the first resistive path is composed of a plurality of resistances associated with a forward biased diode.

7. The method of claim 4 wherein the second resistive path is composed of a resistor.

8. The method of claim 4 wherein the first resistive path is substantially less resistive than the second resistive path.

9. The method of claim 4 wherein the rate of discharge of the gate voltage of the MOSFET through the first resistive path is greater than the rate of discharge through the second resistive path whereby inductive flyback is minimized during discharge of the gate voltage of the MOSFET through the first resistive path by minimizing the change in current in the MOSFET and inductive flyback is minimized during discharge of the gate voltage of the MOSFET through the gate voltage of the MOSFET through the second resistive path by minimizing the time for the discharge of the remainder of the gate voltage of the MOSFET.

* * * * *